United States Patent [19]
Dorey et al.

[11] 4,420,721
[45] Dec. 13, 1983

[54] ELECTRICITY METERS
[75] Inventors: Howard A. Dorey, Godalming, England; Anthony J. Ley, Sceaux, France
[73] Assignee: Sangamo Weston Limited, Enfield, England
[21] Appl. No.: 232,498
[22] Filed: Feb. 9, 1981
[30] Foreign Application Priority Data
 Feb. 7, 1980 [GB] United Kingdom ................. 8004198
[51] Int. Cl.³ ........................................... G01R 11/24
[52] U.S. Cl. .................................... 324/110; 340/637; 361/45
[58] Field of Search ............... 324/110, 111, 142, 127; 361/44, 45, 46; 340/637, 649, 650, 651
[56] References Cited
U.S. PATENT DOCUMENTS
 4,331,915 5/1982 Fielden ................................ 324/110

Primary Examiner—Ernest F. Karlsen
Attorney, Agent, or Firm—Dale Gaudier

[57] ABSTRACT

An electricity meter for metering the amount of electrical energy supplied by a power supplier to a power consumer is provided with fraud detection means for detecting the presence of an external shunt which has been connected to by-pass its internal current sensing means. The detection means, which comprises a differential current sensor for sensing the difference between the respective currents flowing to and from the consumer via the meter and a multiplier for multiplying this current difference by a signal derived from the supply voltage, is arranged to operate a circuit breaker, and/or to compensate the energy measurement of the meter, and/or to provide a warning to the supplier. The differential current sensor also senses when current is being taken between the live wire and earth on the consumer's side of the meter.

7 Claims, 6 Drawing Figures

4,420,721

ELECTRICITY METERS

BACKGROUND OF THE INVENTION

This invention relates to electricity meters, eg watt-hour meters, and is more particularly concerned with electricity meters incorporating means for counteracting certain methods of fraud.

One common method of defrauding an electromechanical electricity meter of the rotating disc type is to slow down the rotating disc by external means, such as a piece of wire arranged to bear on the disc or a powerful magnet. However, with the advent of electronic meters, for example of the kind described and claimed in U.S. Pat. No. 4,359,684, this method of fraud will no longer be possible.

Another common method of defrauding an electricity meter is to connect an external shunt in parallel with the meter. More specifically, the external shunt is connected in parallel with the live wire of the power distribution circuit in which the meter is connected, i.e. the wire in which the current sensor of the meter is connected, so that at least some of the current used by the consumer bypasses the meter and therefore does not contribute to the energy measurement effected by the meter. This method of fraud can be used with both electromechanical and electronic meters, and it is an object of the present invention to counteract it.

SUMMARY OF THE INVENTION

According to the present invention, there is provided an electricity meter for measuring the amount of electrical energy supplied by an electrical power supplier to an electrical power consumer via an electrical power distribution circuit consisting of at least two wires, the meter comprising:

current sensing means for sensing the current flowing in at least one of the wires; and means responsive to the current sensed by the current sensing means for deriving the energy measurement;

the meter being characterised by fraud detection means for detecting attempts to fraudulently bypass the meter, said fraud detection means being operative to produce a signal indicative of such an attempt when the resistive component of the difference between the respective currents flowing to and from the consumer via the meter exceeds a predetermined value.

It will be appreciated that the expression "the resistive component of the difference between the respective currents flowing to and from the consume via the meter" means the component of this current difference which is in phase with the voltage between the two wires.

BRIEF DESCRIPTION OF THE DRAWING FIGURES

The invention will now be described, by way of example only, with reference to the accompanying drawings, of which:

DESCRIPTION OF THE PREFERRED EMBODIMENTS

Figure 1:
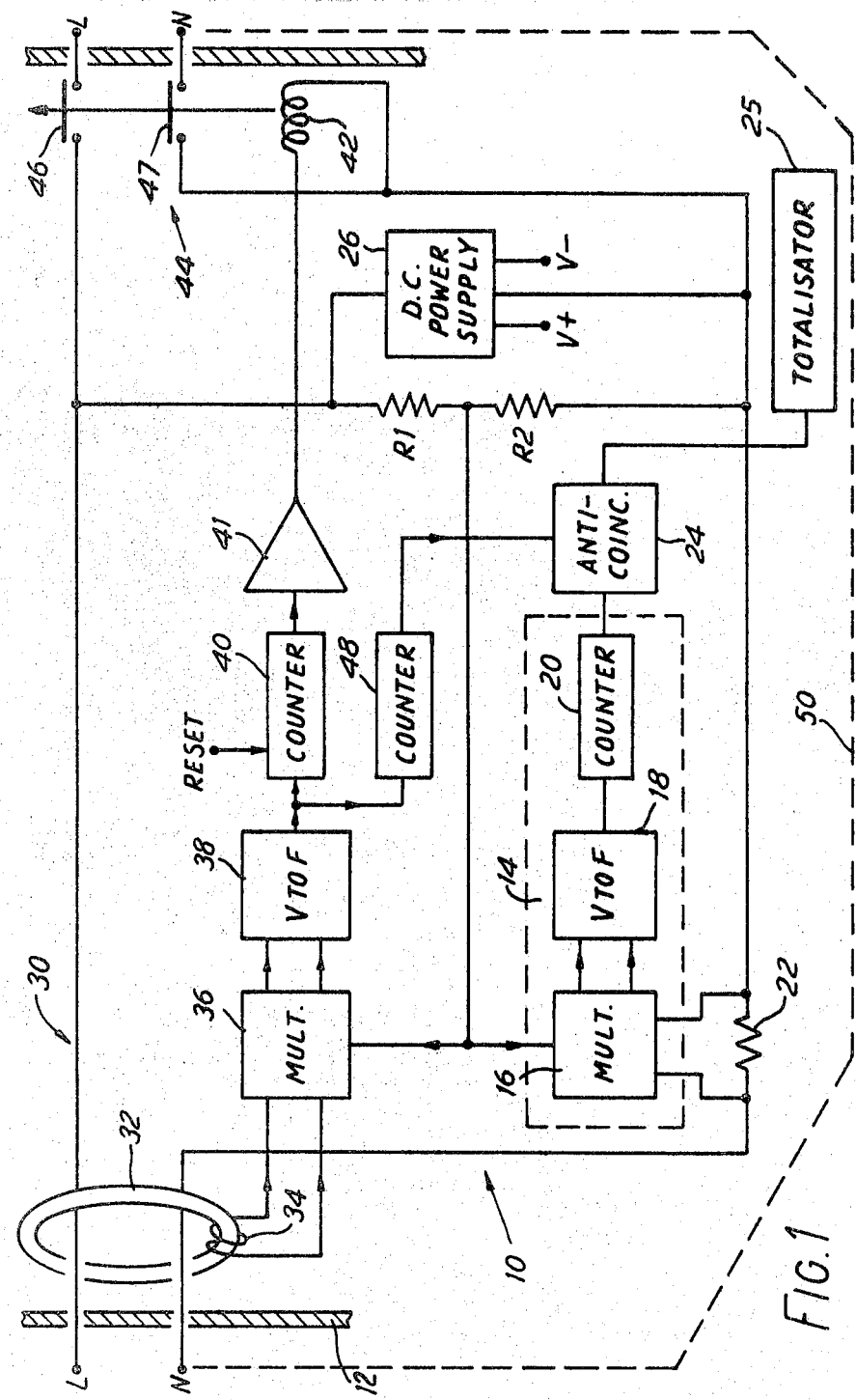
FIG. 1 is a simplified schematic circuit diagram of a first embodiment of an electronic electricity meter in accordance with the present invention.

The electricity meter of FIG. 1 is indicated generally at 10, and is shown connected in a domestic electrical power distribution circuit consisting of a live wire L and a neutral wire N having a typical voltage of 220 to 240 volts, AC, at 50 Hz, therebetween. The electrical power supplier's power generation installation will be assumed to be connected to the left hand ends of the wires L and N, as viewed in FIG. 1, while the electrical power consumer's installation will be assumed to be connected to the right hand ends of the wires L and N.

The meter 10 comprises a sealed housing 12 made from a suitable electrically insulating plastics material, and contains an electronic circuit 14 implemented as a large scale integrated (LS1) circuit and comprising an electronic multiplier 16, a voltage-to-frequency converter 18 and a reversible counter 20. The multiplier 16 has a first pair of inputs connected to receive a signal representative of the current I flowing in the neutral wire N, this current-representative signal being produced by a shunt 22 series connected in the neutral wire, and a second input connected to receive a signal representative of the voltage V between the wires L and N, this voltage-representative signal being produced by a potential divider consisting of resistors R1 and R2 series connected between the wires. The output signal produced by the multiplier 16, which output signal is representative of the instantaneous value of the product VI, is applied to the converter 18. The output pulses from the converter 18, whose instantaneous pulse rate is thus dependent on the product VI, are applied to the counter 20, where they are accumulated in order to integrate them with respect to time.

The counter 20 has an overflow output which is connected to one input of an anti-coincidence circuit 24. The circuit 24, whose full purpose will become apparent later, transmits the overflow pulses produced by the counter 20 to a totalisator or other suitable indicating device 25, which thus produces an indication of the total amount of electrical energy supplied via the meter 10 to the consumer.

The electronic circuit 14 derives the DC power supply voltages necessary for its operation from a transformerless DC power supply 26, which is connected between the wires L and N and arranged to generate the power supply voltages with respect to the neutral wire N.

The meter 10 as described so far is constructed substantially as described in more detail in the aforementioned U.S. Pat. No. 4,359,684, whose description is expressly incorporated by reference herein, and preferably substantially as described with reference to FIGS. 6 and 7 thereof, except for:

(i) the connection of the shunt 22 in the neutral wire N instead of in the live wire L, and the consequent referencing of the DC power supply voltages produced by the power supply 26 to the neutral wire instead of to the live wire (i.e. the effective reversal of the roles played by the wires L and N with respect to the electronic circuit 14, the shunt 22, the potential divider R1,R2 and the power supply 26); and (ii) the provision of the anti-conicidence circuit 24. Although these differences do not affect the way in which the meter 10 operates to effect its energy measurement, it will be appreciated that the connection of the shunt 22 in the neutral wire N is a radical departure from the practice in prior art electricity meters. Thus in prior art electricity meters, the current sensing means, normally a current transformer rather than a shunt, has always been connected to sense the current flowing in the live wire L, in order to ensure that any current taken between the live wire and earth is metered. To overcome the problem that this departure might otherwise cause, the meter 10 is provided with means, generally indicated at 30, for sensing the difference between the respective currents flowing in the wires L and N.

The current difference sensing means 30 comprises a toroidal core 32 through which both of the wires L and N are arranged to pass, and a sensing coil 34 wound around at least a part of the core. The opposite ends of the coil 34 are connected to the first pair of inputs of a multiplier 36, which is substantially identical to the multiplier 16. The second input of the multiplier 36 is connected to receive the voltage-representative signal produced by the potential divider R1, R2, while its output is connected to a voltage-to-frequency converter 38 substantially identical to the converter 18.

The output of the converter 38 is connected to the count input of a presettable reversible counter 40. The counter 40 has a reset input connected to receive periodic reset pulses, eg every 20 milliseconds, and an output at which it produces an output pulse each time it reaches a predetermined count. The reset pulses may be derived in any convenient way, either from the 50 Hz voltage between the wires L and N or from clock pulses used within the electronic circuit 14. The output of the counter 40 is connected via a suitable amplifier 41 to energise the coil 42 of a latching circuit breaker 44, which has switching contacts 46, 47 in the wires L and N respectively down-circuit of the connections of the remainder of the meter circuitry to these wires.

The output of the converter 38 is also connected to the count input of a counter 48 substantially identical to the counter 20. The overflow output of the counter 48 is connected to another input of the anti-coincidence circuit 24, which interleaves the overflow pulses produced by the counter 48 between those produced by the counter 20 for transmission to the aformentioned totalisator or other indicating device.

The multiplier 36, the converter 38, the counters 40 and 48 and their associated circuitry derive the power supplies necessary for their operation from the power supply 26: in practice, they may be constituted by an LS1 circuit substantially identical to the circuit 14.

In operation, if the consumer attempts to steal electricity, either by connecting an external shunt to bypass the current sensing shunt 22 (i.e. between points in the neutral wire N to the left and right respectively of the meter 10, as indicated in dotted lines at 50), or by taking current between the live wire L down-circuit of the meter 10 and earth, the current flowing in the neutral wire within the meter 10 will be reduced by the amount of the stolen current (i.e. the current flowing in the external shunt or to earth respectively). However, the current flowing in the live wire L will not change, so there will be a net current flow equal to the stolen current through the core 32. A voltage representative of this net flow current will therefore be induced in the sensing coil 34. This voltage is multiplied by the voltage-representative signal produced by the potential divider R1,R2 in the multiplier 36, the resulting product signal is converted into a train of pulses of corresponding frequency by the voltage-to-frequency converter 38, and the pulses are counted in the counters 40 and 48.

The difference between the presettable and predetermined counts of the counter 40, and the time interval between successive reset pulses applied to its reset input, are selected such that as long as the integral of the frequency-converted product signal does not reach a predetermined magnitude within the time interval, i.e. as long as the component of the net current flowing through the core 32 in phase with the voltage between the wires L and N does not exceed a given threshold level, the counter is always reset to its presettable count before reaching the predetermined count. However, when the in-phase component of the net current flowing through the core 32 exceeds the given threshold level, the counter 40 is able to reach the predetermined count, whereupon it produces an output pulse which operates the circuit breaker 44. The circuit breaker 44 thus operates to disconnect the consumer's supply of power, since although the contacts 46 in the live wire L are by-passed by the external shunt, the contacts 47 in the neutral wire N are not by-passed.

The frequency of the pulses produced by the voltage-to-frequency converter 38 when the circuit breaker 44 is not open is of course proportional to the power being stolen by means of the external shunt. These pulses are integrated, i.e. counted, in the counter 48, whose overflow pulses are, as already mentioned, interleaved with those of the counter 20 before being applied to the aforementioned totalisator or other indicating device 25. Accordingly, the indications of the totalisator or other device 25 are corrected (i.e. increased) to compensate for the total amount of the stolen energy. By appropriate selection of the operating characteristics of the multiplier 36, the converter 38 and the counter 48, the compensation can be made relatively accurate, or indeed substantially increased to overcompensate and thus penalise the consumer for attempting to steal electricity.

Under these circumstances, the difference current threshold at which the circuit-breaker 44 opens can be made relatively high, and the circuit-breaker can be arranged to be resettable only upon opening the sealed housing 12 of the meter 10, so that the consumer cannot readily reset it without leaving evidence of tampering.

However, if it is desired that the circuit breaker 44 should serve primarily as a safety device, the difference current threshold should be made sufficiently low that the circuit breaker operates for a difference current below the lethal level. In this case, the circuit breaker 44 should preferably be arranged to be resettable by the consumer, e.g. by means of a push-button accessible from the outside of the housing 12 of the meter 10.

Figure 1A:
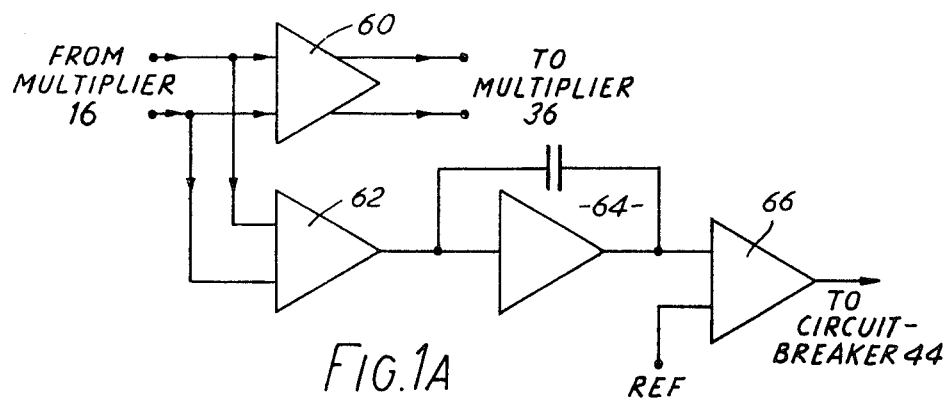
FIGS. 1A and 1B show modifications which can be made to the meter of FIG. 1.

Various modifications can be made to the described embodiment of the invention. For example, the converter 38 and the counters 40 and 48 can be replaced by two differential buffer amplifiers 60 and 62, an analogue integrator 64 and an analogue comparator 66, as shown in FIG. 1A. The differential amplifier 60 has differential (or push-pull) outputs, and is used to sum the output of the multiplier 36 directly with that of the multiplier 16, in order to effect the above-discussed compensation of the energy measurement. The other differential amplifier 62 supplies the integrator 64, and the comparator 66 compares the output of the integrator with a reference signal and operates the circuit-breaker 44 when this output exceeds the reference signal.

The amplifiers 60,62, the integrator 64 and the comparator 66 are preferably implemented as part of the LSI circuit forming the electronic circuit 14.

Figure 1B:
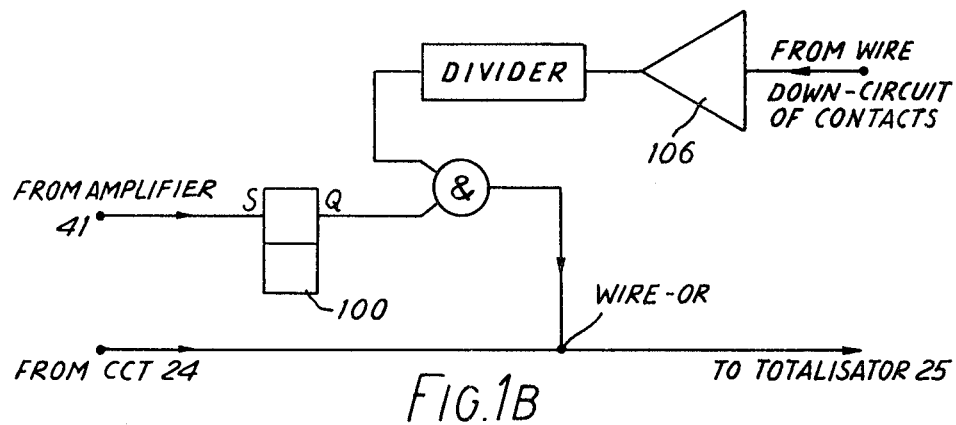

Another modification which can be made to the described embodiment of the invention is to provide means for sensing the presence of the supply voltage down-circuit of the meter 10 after operation of the circuit-breaker 44, which presence is a firm indication that the meter 10 has been completely by-passed. Such sensing means can be implemented by additionally connecting the output of the amplifier 41 to the set input of a bistable circuit 100, shown in FIG. 1B. The set output of the bistable circuit 100 is connected to one input of an AND gate 102, whose other input is connected to the output of a frequency divider 104. The output of the AND gate 102 is wire-OR connected to the output of the anti-coincidence circuit 24, while the input of the frequency divider 104 is connected to receive a 50 Hz square wave signal derived from the live wire L down-circuit of the contacts 46 by means of a suitable squaring amplifier 106.

Under circumstances where the aforementioned difference current threshold has not been exceeded (and the circuit-breaker 44 has therefore not been operated), the AND gate 102 is disabled by the signal at the set output of the bistable circuit 100. However, when the amplifier 41 operates the circuit-breaker 44 for either of the reasons mentioned earlier (presence of an external shunt, or current being taken between the live wire L down-circuit of the meter 10 and earth), it also sets the bistable circuit 100, since it will be appreciated that operation of the circuit-breaker 44 leaves the electronic circuit 14 and the other electronic circuitry of the meter 10 energised and therefore operative. The setting of the bistable circuit 100 enables the AND gate 102.

Thus if the consumer has connected an external shunt between respective points in the live wire up-circuit and down-circuit of the meter 10, in order to by-pass the open contacts 46 of the circuit-breaker 44 and thereby permit current to be taken (or to continue to be taken) between the live wire L down-circuit of the meter and earth, the squaring amplifier 44 will still be receiving a 240 volt, 50 Hz signal and will therefore still be producing a 50 Hz square wave. The division ratio of the frequency-divider 104 can be selected such that the frequency of the pulses at its output drives the totalisator or other device 25 at a predetermined rate, for example substantially at its maximum rate. The output of the frequency-divider 104 can also be arranged to flash a suitable warning light, to discourage the consumer from continuing attempting to steal electricity.

The squaring amplifier 44 can obviously be replaced by any suitable detection circuit which is capable of detecting the presence of the supply voltage down-circuit of the contacts 46 after operation of the circuit-breaker 44. In this case, the output of the detection circuit is used to appropriately increase the energy measurement indicated by the totalisator or other indicating device 25. Equally obviously, the embodiments of FIGS. 1,1A and 1B can readily be modified to permit the shunt 22 or other current sensing means to be connected in the live wire L rather than in the neutral wire N.

Figure 2:
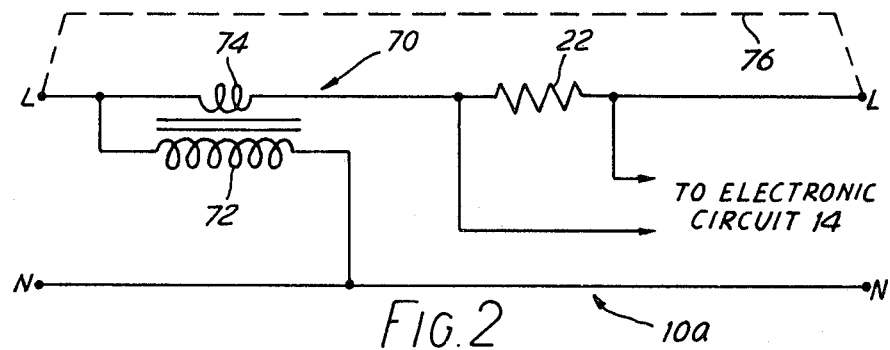
FIGS 2 to 4 are simplified schematic circuit diagrams of second to fourth embodiments respectively of electronic electricity meters in accordance with the present invention.

The meter of FIG. 2 is indicated generally at 10a, and has various elements in common with the meter 10 of FIG. 1: these elements accordingly bear the same references as were used in FIG. 1, and only the points of difference will be described.

Thus the shunt 22 of the meter 10a is connected in the live wire L rather than in the neutral wire N, but otherwise is connected to an electronic circuit 14 substantially identical to that of the meter 10 of FIG. 1: this circuit thus effects an energy measurement based on the voltage drop across the shunt 22 and the voltage between the wires L and N as described in the aforementioned U.S. Pat. No. 4,359,684.

The meter 10a also includes a transformer 70, having a primary winding 72 connected between the wires L and N up-circuit (i.e. on the supplier's side) of the shunt 22 and a secondary winding 74 connected in series with the shunt on its up-circuit side. As can be seen in FIG. 2, the transformer 70 is in fact a step-up auto-transformer.

Assuming that the supply voltage is 240 volts AC, the shunt 22 has a resistance of about 1 milliohm and the meter 10a has a maximum current capability of 100 amps, the secondary winding 74 is typically arranged to produce a voltage of about 0.1 volts A.C.

Under normal conditions, the presence of the transformer 70 has practically no effect: it merely increases the supply voltage at the meter 10a from 240 volts AC to 240.1 volts A.C.

However, if the consumer connects an external shunt to bypass the shunt 22 (i.e. between respective points in the live wire L up-circuit and down-circuit of the meter 10a, as indicated at 76), the current flowing in the shunt 22 is increased by the voltage induced in the secondary winding 74 of the transformer 70 by an amount which increases as the resistance of the external shunt decreases. In the limit, as the resistance of the external shunt tends to zero, the current in the shunt 22 tends to 100 amps (0.1 volts A.C. across 1 milliohm). In practice, it would be difficult if not impossible to connect an external shunt whose resistance is very low compared to 1 milliohm without leaving obvious evidence of tampering, but it will be appreciated that the transformer 70 can readily be arranged either to substantially compensate, or even to overcompensate, for the presence of external shunts which do not produce obvious evidence of tampering. Several modifications can be made to the meter 10a of FIG. 2. In particular, the respective positions of the shunt 22 and the secondary winding 74 can be interchanged.

Figure 3:
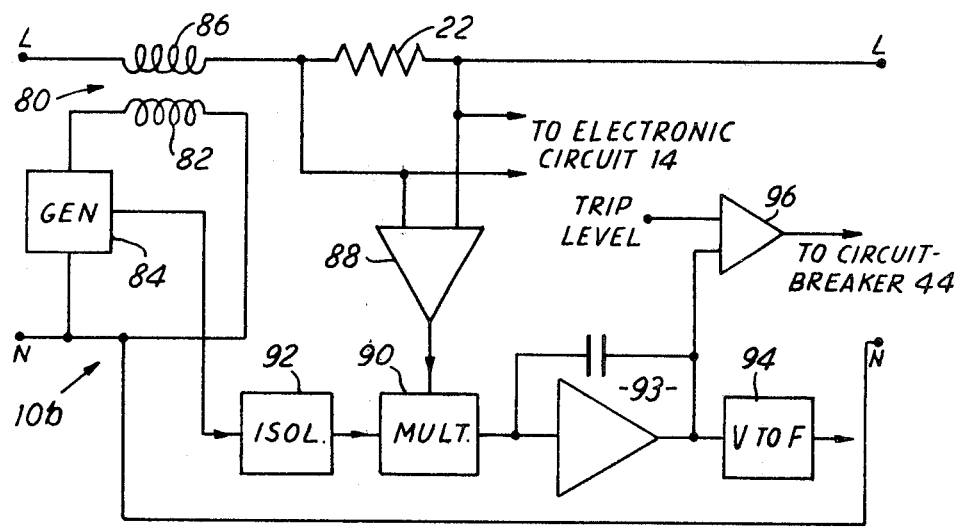

The meter of FIG. 3 is indicated generally at 10b, and again has various elements in common with the meters 10 and 10a of FIGS. 1 and 2: these common elements have therefore again been given the same references as were used in FIGS. 1 and 2.

The shunt 22 and associated electronic circuit of the meter 10b are arranged in a manner substantially identical to that employed in the meter 10a of FIG. 2. However, the transformer 70 of FIG. 2 is replaced by a transformer 80 having a primary winding 82 connected to a reference signal generator 84, and a secondary winding 86 arranged to inject a reference signal from the generator 84 in series with the shunt 22. The reference signal may be an alternating signal whose frequency is higher than (but not a harmonic of) the 50 Hz supply frequency, or a pseudo-random binary coded signal.

A detecting amplifier 88 is connected to receive and amplify the voltage across the shunt 22, and to apply it to one input of a multiplier 90. The other input of the multiplier 90 is connected to receive a version of the reference signal which has been derived from the generator 84 via a suitable electrically-isolating coupling 92, while the output of the multiplier is connected to the input of an integrator 93. The output of the integrator 93 is connected to a voltage-to-frequency converter 94, and to a comparator 96.

Under normal conditions, the minimum resistance of the load which the consumer may connect to the power distribution circuit is relatively high compared to the 1 milliohm resistance of the shunt 22, so that a very low voltage is generated across the shunt 22 by the injected reference signal. The integrator 93 therefore produces no significant output, since the signals being received and multiplied by the multiplier 90 are effectively uncorrelated.

However, if the consumer connects an external shunt as described in relation to FIG. 2, substantially all of the injected reference signal will appear across the shunt 22. The multiplier 90 will therefore receive two input signals of similar envelope, and the resulting product signal, now having a non-zero average value, will be integrated by the integrator 93. When the output of the integrator 93 exceeds the trip level of the comparator 96, the latter operates the circuit breaker 44. While the integrator 93 produces a significant output which is nevertheless below the trip level of the comparator 96, the converter 94 produces output pulses whose frequency increases as the resistance of the external shunt decreases. These pulses are combined with pulses produced in the electronic circuit 14 of the meter 10b in any convenient manner, eg in a manner analogous to that described earlier, to compensate (or overcompensate) the energy measurement being effected by the meter for the presence of the external shunt.

Figure 4:
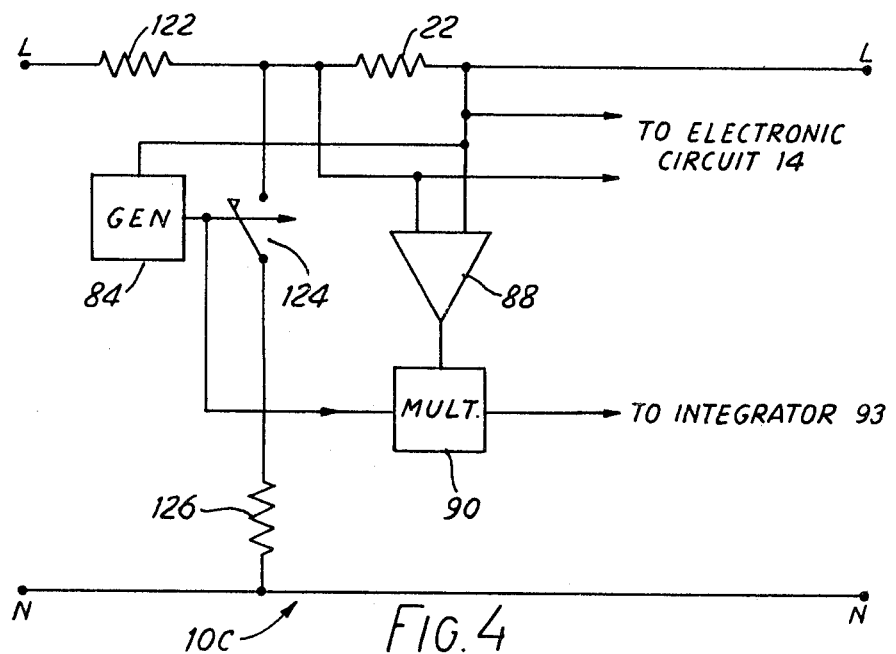

The meter of FIG. 4 is indicated generally at 10c, and is similar in its principle of operation to the meter 10b of FIG. 3. The meter 10c has various elements in common with all three of the meters 10, 10a and 10b already described, so the same references are used once again for these common elements.

The shunt 22 and associated electronic circuit 14 of the meter 10c are arranged substantially as described in relation to the meter 10b of FIG. 3, but the method of injecting the reference signal is somewhat different from that used in the meter 10b. In particular, the transformer 80 is replaced by a low value resistor 122, typically substantially equal in value to the shunt 22, and the generator 84 is arranged to produce a low duty ratio cyclic waveform which drives a switch 124 arranged to connect a load resistor 126 between the neutral wire N and the junction between the shunt 22 and the resistor 122. It will also be noted that the generator 84 is referenced to the live wire L, eliminating the need for the isolating circuit 92 and enabling it to use the power supply 26 of the electronic circuit 14.

As in the meter 10b of FIG. 3, the detecting amplifier is connected to receive and amplify the voltage across the shunt 22, which contains a significant component due to the reference signal injected by the operation of the switch 124 only in the presence of the aforementioned external shunt. This component is processed as described in relation to FIG. 3.

Although the switch 124 is illustrated as an elecromechanical switch, in practice it is a solid state switch.

In the embodiments of FIGS. 3 and 4, the shunt 22 is effectively used to sense the change in the magnitude of the component of the injected reference signal when an external shunt is connected to by-pass the shunt 22. However, if more convenient, a separate sensing device, such as a low value resistor in series with the shunt 22, can be provided.

Various modifications can be made to all the described embodiments of the invention. In particular, in the several embodiments including the circuit-breaker 44, the signal used to operate the circuit-breaker (i.e. the respective signals produced by the amplifier 41 and the comparators 66 and 96) can additionally or alternatively be used to operate a warning to the supplier. This warning can for example take the form of a warning flag which appears in the display window of the totalisator or other device 25, which flag can if desired be arranged to be relatively unobvious to the consumer. Alternatively, the flag can be arranged to be visible only upon opening the sealed housing 12 of the meter. As another alternative, if the meter incorporates a remote signalling facility, such as a remote reading facility, which enables it to send coded signals to the supplier's installation, e.g. by modulating the coded signals onto the supply voltage so as to send them via the distribution circuit itself, then the warning can take the form of a coded signal which is actually transmitted to the supplier.

Finally, although the various aspects of the invention have been described in relation to electronic electricity meters, they are also applicable, with appropriate modifications, to electromechanical electricity meters.

We claim:

1. An electricity meter for measuring the amount of electrical energy supplied by an electrical power supplier to an electrical power consumer via an electrical power distribution circuit consisting of at least two wires, the meter comprising:

current sensing means for sensing the current flowing in at least one of the wires;

means responsive to the current sensed by the current sensing means for deriving the energy measurement; and fraud detection means for detecting attempts to fraudulently by-pass the meter, said fraud detection means comprising:

means arranged to produce a signal representative of the instantaneous value of the difference between the respective currents flowing to and from the consumer via the meter;

an electronic multiplier arranged to multiply the current difference representative signal by a signal representative of the instantaneous value of the voltage between the wires, to produce a signal representative of the product thereof; and a resettable integrating circuit arranged continuously to receive said product representative signal and to integrate it for a predetermined time prior to each resetting hereof, said integrating circuit including means for producing a signal indicative of an attempt to by-pass the meter when the integral of the product representative signal exceeds a predetermined value within the predetermined time.

2. An electricity meter as claimed in claim 1, wherein the means for producing the current difference representative signal comprises a toroidal core through which each of said wires is arranged to pass, and a coil wound upon at least a portion of said core.

3. An electricity meter as claimed in claim 1, for use in a distribution circuit having a live wire and a neutral wire, wherein the current sensing means is arranged to sense the current flowing in the neutral wire.

4. An electricity meter as claimed in claim 1, further comprising means, responsive to said signal indicative of an attempt to bypass the meter, to discontinue the supply of electricity to the consumer.

5. An electricity meter as claimed in claim 1, further comprising means, responsive to said signal indicative of an attempt to bypass the meter, to transmit the signal to the supplier.

6. An electricity meter as claimed in claim 1, further comprising means, responsive to said signal indicative of an attempt to bypass the meter, to operate a signal device associated with the meter.

7. An electricity meter as claimed in claim 1, further comprising means, responsive to said signal indicative of an attempt to bypass the meter, to at least partly compensate the energy measurement for the effect of the attempt.

* * * * *